(12) United States Patent
Hu et al.

(10) Patent No.: US 11,545,606 B2
(45) Date of Patent: Jan. 3, 2023

(54) ELECTRONIC DEVICE AND METHOD FOR MANUFACTURING THE SAME

(71) Applicant: InnoLux Corporation, Miao-Li County (TW)

(72) Inventors: Shun-Yuan Hu, Miao-Li County (TW); Ming-I Chao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/338,735

(22) Filed: Jun. 4, 2021

(65) Prior Publication Data

US 2021/0296551 A1 Sep. 23, 2021

Related U.S. Application Data

(62) Division of application No. 16/387,850, filed on Apr. 18, 2019, now Pat. No. 11,063,195.

(60) Provisional application No. 62/676,321, filed on May 25, 2018.

(30) Foreign Application Priority Data

Aug. 27, 2018 (CN) .......................... 201810981438.0

(51) Int. Cl.
*H01L 33/62* (2010.01)
*H01L 23/00* (2006.01)
*H01L 25/075* (2006.01)
*H01L 33/36* (2010.01)

(52) U.S. Cl.
CPC .............. *H01L 33/62* (2013.01); *H01L 24/75* (2013.01); *H01L 24/80* (2013.01); *H01L 24/97* (2013.01); *H01L 25/0753* (2013.01); *H01L 33/36* (2013.01); *H01L 2224/7598* (2013.01); *H01L 2224/75651* (2013.01);
(Continued)

(58) Field of Classification Search
None
See application file for complete search history.

(56) References Cited

U.S. PATENT DOCUMENTS

| | | | |
|---|---|---|---|
| 10,186,549 B1 * | 1/2019 | Cheung | H01L 33/005 |
| 2010/0123268 A1 * | 5/2010 | Menard | H01L 24/97 264/293 |

(Continued)

*Primary Examiner* — Steven M Christopher
(74) *Attorney, Agent, or Firm* — McClure, Qualey & Rodack, LLP (57) ABSTRACT

An electronic device is provided, including a substrate, a plurality of bonding pads, and a plurality of light emitting members. The bonding pads are disposed on the substrate. The light emitting members are disposed on the bonding pads. The light emitting members include a first pair of adjacent light-emitting members, a second pair of adjacent light-emitting members, and a third pair of adjacent light-emitting members. The first pair of adjacent light-emitting members, the second pair of adjacent light-emitting members, and the third pair of adjacent light-emitting members are arranged along the first direction in sequence. The first pair of adjacent light-emitting members has a first pitch, the second pair of adjacent light-emitting members has a second pitch, and the third pair of adjacent light-emitting members has a third pitch. The third pitch is greater than the second pitch, and the second pitch is greater than the first pitch.

20 Claims, 10 Drawing Sheets

(52) U.S. Cl.
CPC ............ *H01L 2224/75841* (2013.01); *H01L 2224/80805* (2013.01); *H01L 2224/95115* (2013.01); *H01L 2224/97* (2013.01)

(56) References Cited

U.S. PATENT DOCUMENTS

| | | | |
|---|---|---|---|
| 2016/0016399 A1* | 1/2016 | Bower | H01L 24/97 |
| | | | 101/287 |
| 2016/0155892 A1* | 6/2016 | Li | H01L 25/167 |
| | | | 257/89 |
| 2017/0092820 A1* | 3/2017 | Kim | H01L 25/0753 |
| 2017/0373046 A1* | 12/2017 | Gardner | H01L 27/156 |
| 2018/0284465 A1* | 10/2018 | Kwon | H01L 27/3258 |
| 2019/0157501 A1* | 5/2019 | An | H01L 21/6835 |
| 2019/0339570 A1* | 11/2019 | Chen | H01L 51/5281 |

\* cited by examiner

ELECTRONIC DEVICE AND METHOD FOR MANUFACTURING THE SAME

CROSS REFERENCE TO RELATED APPLICATIONS

This application is a Divisional of application Ser. No. 16/387,850, filed Apr. 18, 2019 (now U.S. Pat. No. 11,063,195, issued on Jul. 13, 2021), which claims the benefit of U.S. Provisional Application No. 62/676,321, filed May 25, 2018, and China Patent Application No. 201810981438.0, filed Aug. 27, 2018, the entirety of which are incorporated by reference herein.

BACKGROUND OF THE DISCLOSURE

Field of the Disclosure

The application relates in general to an electronic device, and in particular, to an electronic device having light-emitting members.

Description of the Related Art

Along with the advance in the display technology, various display panels are constantly being invented and provided to consumers. For example, the liquid-crystal display panel, the plasma display panel and the light-emitting diode display panel have long since replaced the conventional cathode ray tube (CRT) display.

In a light-emitting diode display panel, light-emitting diodes have to be joined to a substrate. However, when the substrate becomes warped, it becomes difficult to dispose the light-emitting diodes on the substrate. Therefore, how to address the aforementioned problem has become an important issue.

BRIEF SUMMARY OF DISCLOSURE

To address the deficiencies of conventional products, an embodiment of the disclosure provides an electronic device, including a substrate, a plurality of bonding pads, and a plurality of light emitting members, wherein the bonding pads are disposed on the substrate, and the light emitting members are disposed on the bonding pads. The light emitting members include a first pair of adjacent light-emitting members, a second pair of adjacent light-emitting members, and a third pair of adjacent light-emitting members. The first pair of adjacent light-emitting members, the second pair of adjacent light-emitting members, and the third pair of adjacent light-emitting members are arranged along the first direction in sequence. The first pair of adjacent light-emitting members has a first pitch, the second pair of adjacent light-emitting members has a second pitch, and the third pair of adjacent light-emitting members has a third pitch. The third pitch is greater than the second pitch, and the second pitch is greater than the first pitch.

BRIEF DESCRIPTION OF DRAWINGS

The disclosure can be more fully understood by reading the subsequent detailed description and examples with references made to the accompanying drawings, wherein.

DETAILED DESCRIPTION OF DISCLOSURE

The making and using of the embodiments of the electronic device and method for manufacturing the same are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
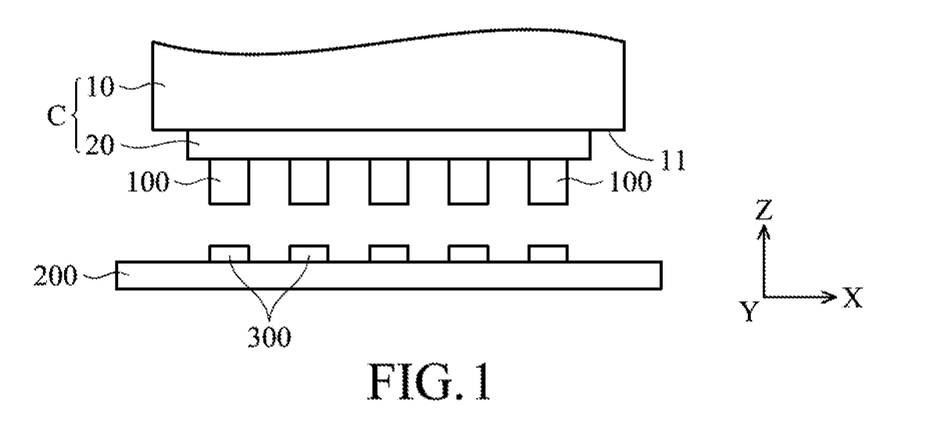
FIG. 1 is a schematic diagram of a pressure bonding device, a plurality of light-emitting members, a substrate, and a plurality of bonding pads according to an embodiment of the disclosure.

Referring to FIG. 1, in an embodiment of the present disclosure, a pressure bonding device C includes a bonding head 10 and a flexible layer 20, wherein the flexible layer 20 is affixed to a bonding surface 11 of the bonding head 10. In some embodiments, the flexible layer 20 is adhesive, and the bonding head 10 can catch members. In some embodiments, the flexible layer 20 is non-adhesive (the bonding head 10 is merely used to pressure bond the members, but is not used to catch the members). For example, the flexible layer 20 can include polymer material or photoresist material, and the thickness of the flexible layer 20 can be 0.5-200 μm (such as 1-50 μm). The material and the thickness of the flexible layer 20 are not limited to the aforementioned example.

Figure 2:
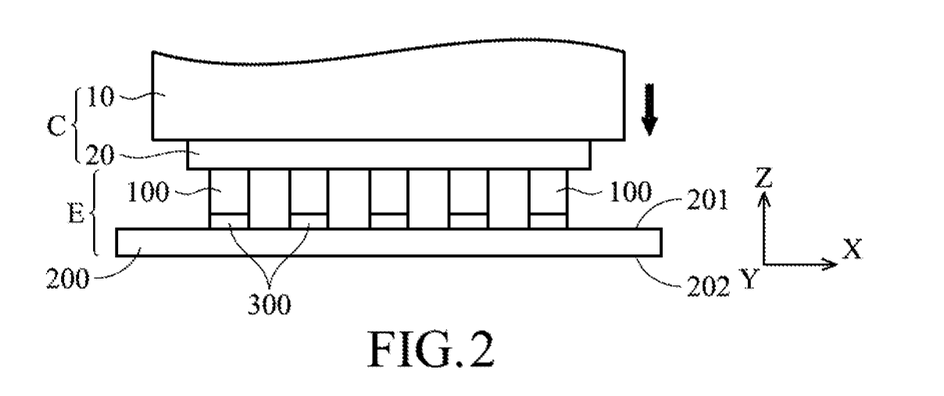
FIG. 2 is a schematic diagram that represents that the light-emitting members contact the bonding pads via the pressure bonding device according to an embodiment of the disclosure, wherein the surface of the substrate for disposing the bonding pads is flat.

The bonding head 10 can be assembled on a movable mechanism (not shown). As shown in FIG. 1, a plurality of light-emitting members 100 (such as light-emitting diode chip, LED chip) can be attached to the flexible layer 20, and the movable mechanism can move the bonding head 10 to a position above a substrate 200. The substrate 200 can be a hard board (for example, including glass or sapphire) or a soft board (for example, including PI or PET). The substrate 200 is not limited to the aforementioned example, as long as it can provide a sufficient supporting force. As shown in FIG. 2, subsequently, the bonding head 10 can move downwardly, and the light-emitting members 100 on the flexible layer 20 can contact bonding pads 300 on the substrate 200. Therefore, the light-emitting members 100 can be joined to the bonding pads 300, via eutectic bonding for example, but it is not limited thereto.

Since the bonding force of eutectic bonding is greater than the adhesive force between the flexible layer 20 and the light-emitting members 100, the bonding head 10 can move upwardly after the process of eutectic bonding is finished, and the light-emitting members 100 can be detached from the flexible layer 20. The substrate 200, the bonding pads 300, and the light-emitting members 100 assembled in the aforementioned steps can form an electronic device of the present disclosure.

As shown in FIG. 2, if a surface 201 of the substrate 200 (where the bonding pads 300 is disposed) is horizontal, the light-emitting members 100 on the flexible layer 20 can simultaneously contact the bonding pads 300 on the substrate 200 when the bonding head 10 moves downwardly. The deformation of the flexible layer 20 is not obvious.

Figure 3:
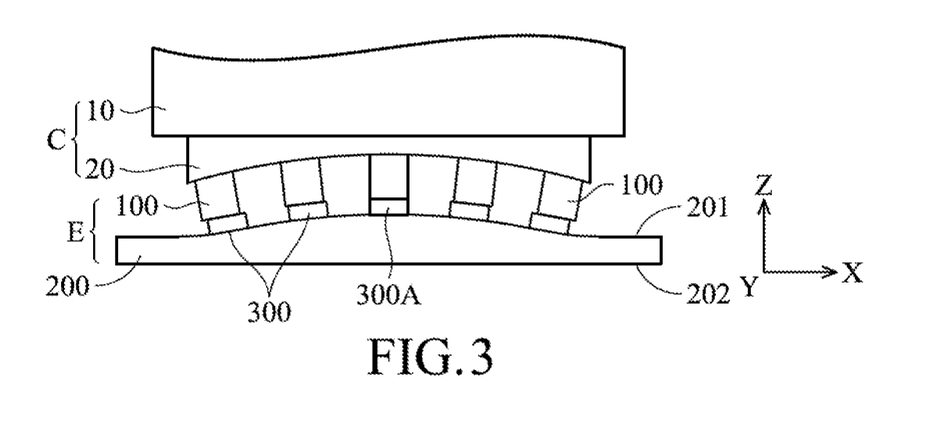
FIG. 3 is a schematic diagram that represents that the light-emitting members contact the bonding pads via the pressure bonding device according to an embodiment of the disclosure, wherein the surface of the substrate for disposing the bonding pads is curved.

Referring to FIG. 3, if a surface 201 of the substrate 200 (where the bonding pads 300 is disposed) is curved, the bonding pads 300 closest to the bonding head 10 first contact the light-emitting member 100 when the bonding head 10 moves downwardly. Subsequently, the flexible layer 20 is deformed, and the other light-emitting members 100 contact the bonding pads 300. In other words, the pressure bonding device C of the present disclosure can be applied on any substrate 200, even if the substrate 200 is warped. The distance between a bottom surface 202 of the substrate 200 and the bonding pad 300A is greater than the distance between the bottom surface 202 and any other bonding pad 300 (i.e. the bonding pad 300A is one of the bonding pads 300 which closest to the bonding head 10). When the bonding pads 300 are joined to the light-emitting members 100, the center of the bonding pad 300A is aligned with the light-emitting member 100, and the centers of other bonding pads 300 are deviated from the centers of the corresponding light-emitting members 100.

Figure 4A:
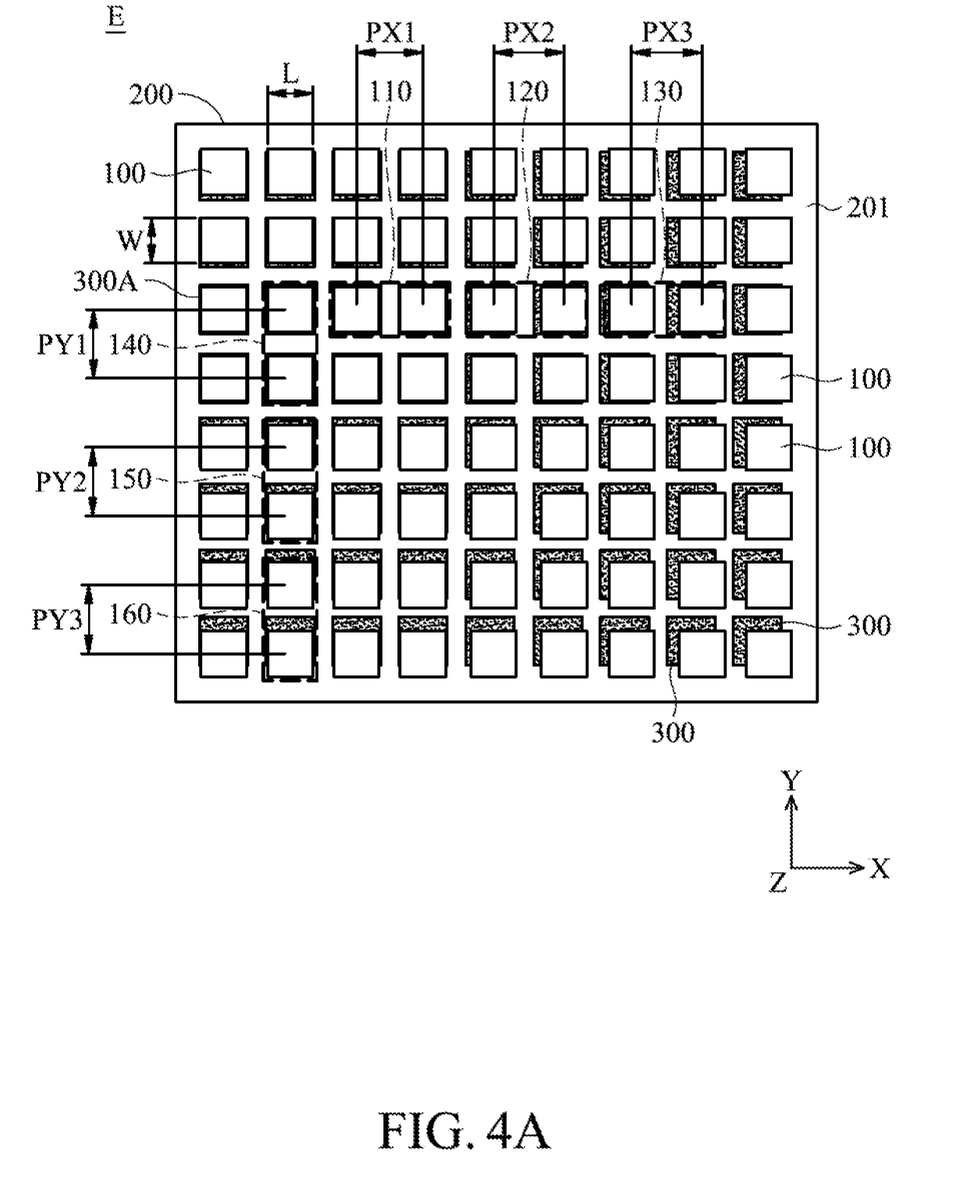
FIG. 4A is a schematic diagram of an electronic device according to an embodiment of the disclosure.

FIG. 4A is a schematic diagram of the light-emitting members 100 and the bonding pads 300 on at least a portion of the substrate 200 when using the pressure bonding device C to dispose the light-emitting members 100 on the curved surface 201 of the substrate 200.

In particular, in a first direction (X-axis), the light-emitting members 100 can be divided into a first group 110, a second group 120, and a third group 130 (in the present disclosure, the group represents the combination of two or more light-emitting members 100 arranged along a direction, and the different groups can include different number of light-emitting members 100). The first group 110, the second group 120, and the third group 130 are arranged along the first direction in sequence. In other words, the second group 120 is disposed between the first group 110 and the third group 130. Each of the first group 110, the second group 120, and the third group 130 includes two light-emitting members 100 adjacent to each other and arranged along the first direction. A first pitch PX1 is formed between the geometric centers of two light-emitting members 100 in the first group 110 (a first pair of adjacent light-emitting members), a second pitch PX2 is formed between the geometric centers of two light-emitting members 100 in the second group 120 (a second pair of adjacent light-emitting members), and a third pitch PX3 is formed between the geometric centers of two light-emitting members 100 in the third group 130 (a third pair of adjacent light-emitting members). Since the bonding pads 300 is disposed at equal intervals, and the third pitch PX3>the second pitch PX2>the first pitch PX1, the light-emitting member 100 more away from the bonding pad 300A is more deviated from the corresponding bonding pad 300 in the first direction.

Similarly, in a second direction (Y-axis), the light-emitting members 100 can be divided into a fourth group 140, a fifth group 150, and a sixth group 160. The fourth group 140, the fifth group 150, and the sixth group 160 are arranged along the second direction in sequence. In other words, the fifth group 150 is disposed between the fourth group 140 and the sixth group 160. Each of the fourth group 140, the fifth group 150, and the sixth group 160 includes two light-emitting members 100 adjacent to each other and arranged along the second direction. A fourth pitch PY1 is formed between the geometric centers of two light-emitting members 100 in the fourth group 140 (a fourth pair of adjacent light-emitting members), a fifth pitch PY2 is formed between the geometric centers of two light-emitting members 100 in the fifth group 150 (a fifth pair of adjacent light-emitting members), and a sixth pitch PY3 is formed between the geometric centers of two light-emitting members 100 in the sixth group 160 (a sixth pair of adjacent light-emitting members). Since the bonding pads 300 is disposed at equal intervals, and the sixth pitch PY3>the fifth pitch PY2>the fourth pitch PY1, the light-emitting member 100 more away from the bonding pad 300A is more deviated from the corresponding bonding pad 300 in the second direction. The term "corresponding" herein is used to describe the light-emitting member 100 and the bonding pad 300 that should be joined to each other.

In this embodiment, the first direction and the second direction respectively correspond to the X-axis and the Y-axis. In some embodiments, the first direction and the second direction are different but not perpendicular.

Figure 4B:
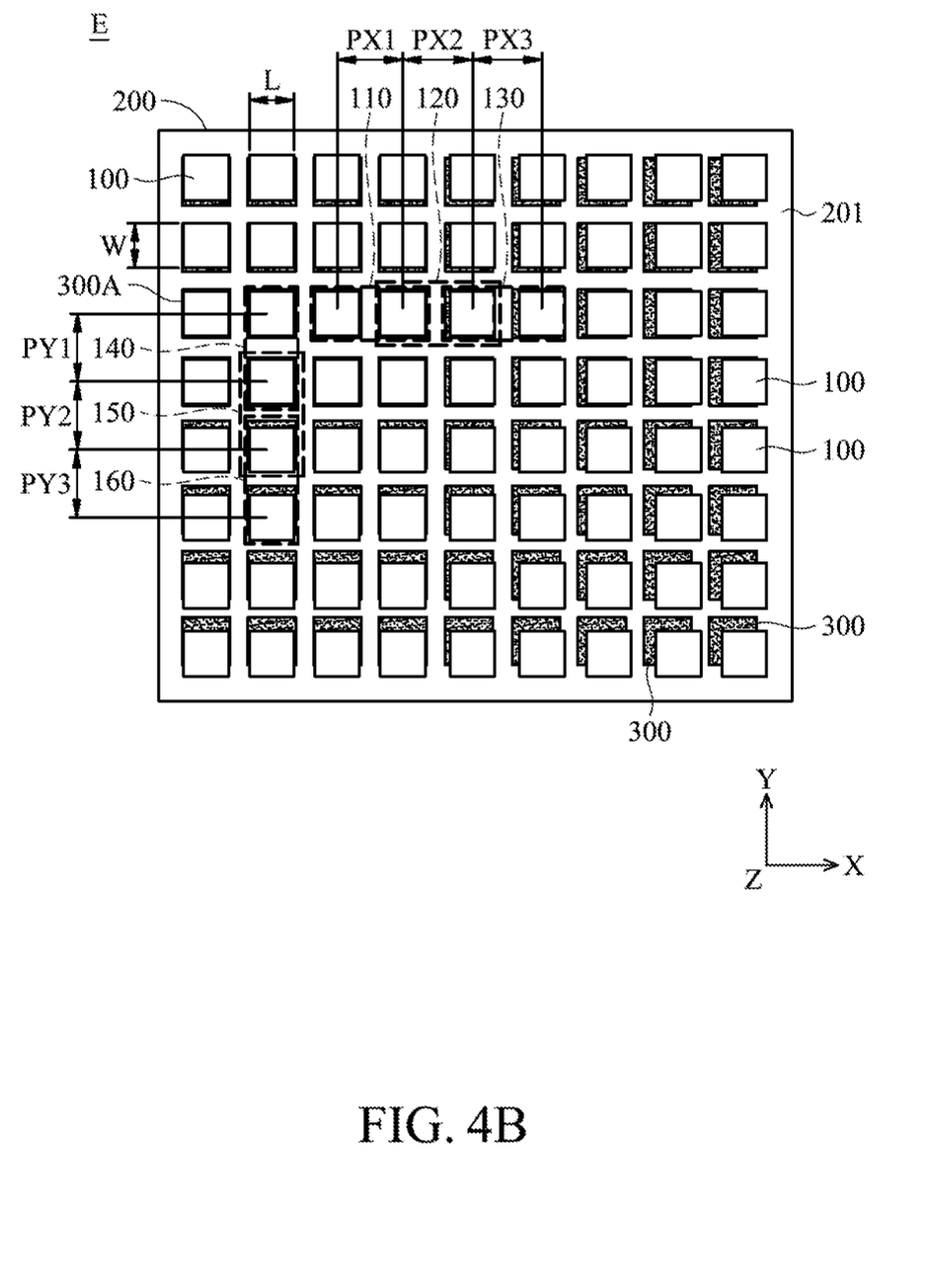
FIG. 4B is a schematic diagram of the electronic device according to an embodiment of the disclosure.

Referring to FIG. 4B, in some embodiments, when the user divides the light-emitting members 100 into the first group 110, the second group 120, and the third group 130 along the first direction (X-axis), one of the light-emitting members 100 can be simultaneously included in the first group 110 and the second group 120, and another light-emitting member 100 can be simultaneously included in the second group 120 and the third group 130. That is, the first group 110 and the second group 120 can share one light-emitting member 100, and the second group 120 and the third group 130 can share another light-emitting member 100. In other words, in this embodiment, one light-emitting member 100 is disposed adjacent to the boundary of two groups and simultaneously belongs in the first group and the second group. This light-emitting member 100 is shared by two groups. Another light-emitting member 100 is disposed adjacent to the boundary of two groups and simultaneously belongs in the second group and the third group, this light-emitting member 100 is also shared by two groups. Similarly, when the user divides the light-emitting members 100 into the fourth group 140, the fifth group 150, and the sixth group 160 along the second direction (Y-axis), one of the light-emitting members 100 can be simultaneously included in the fourth group 140 and the fifth group 150, and another light-emitting member 100 can be simultaneously included in the fifth group 150 and the sixth group 160. That is, the fourth group 140 and the fifth group 150 can share one light-emitting member 100, and the fifth group 150 and the sixth group 160 can share another light-emitting member 100.

In some embodiments, when the number of light-emitting members in each of the groups is two, the first group 110 has a first pair of adjacent light-emitting members 110, the second group 120 has a second pair of adjacent light-emitting members 120, and the third group 130 has a third pair of adjacent light-emitting members 130. The first pair of adjacent light-emitting members 110 and the second pair of adjacent light-emitting members 120 can share one light-emitting member 100, and the second pair of adjacent light-emitting members 120 and the third pair of adjacent light-emitting members 130 can share another light-emitting member 100. In other words, in this embodiment, one light-emitting member 100 simultaneously belongs in the first pair of adjacent light-emitting members 110 and the second pair of adjacent light-emitting members 120. This light-emitting member 100 is shared by the first pair of adjacent light-emitting members 110 and the second pair of adjacent light-emitting members 120. Another light-emitting member 100 simultaneously belongs in the second pair of adjacent light-emitting members 120 and the third pair of adjacent light-emitting members 130, and this light-emitting member 100 is shared by the second pair of adjacent light-emitting members 120 and the third pair of adjacent light-emitting members 130. The fourth group 140 has a fourth pair of adjacent light-emitting members 140, the fifth group 150 has a fifth pair of adjacent light-emitting members 150, and the sixth group 160 has a sixth pair of adjacent light-emitting members 160. The fourth pair of adjacent light-emitting members 140 and the fifth pair of adjacent light-emitting members 150 can share one light-emitting member 100, and the fifth pair of adjacent light-emitting members 150 and the sixth pair of adjacent light-emitting members 160 can share another light-emitting member 100.

Figure 5:
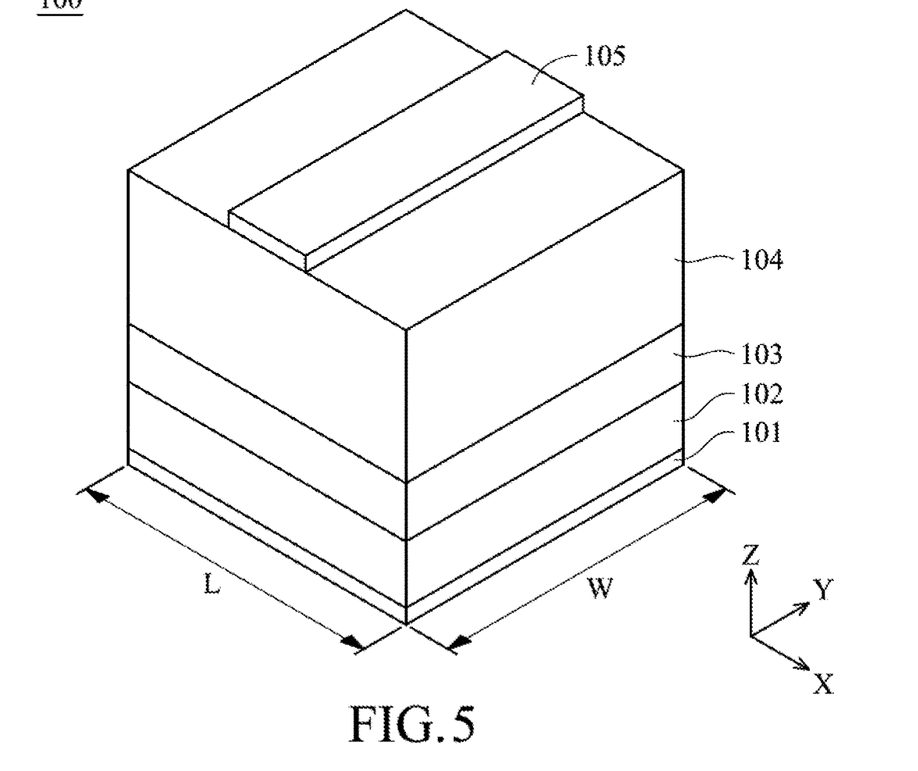
FIG. 5 is a schematic diagram of the light-emitting member according to an embodiment of the disclosure.

It should be noted that the limitation of the deviation between the bonding pad 300 and the light-emitting member 100 is adjusted according to the type of the light-emitting member 100. For example, in this embodiment, the light-emitting member 100 is a vertical LED chip, including a first electrode 101, a first material layer 102, a light-emitting layer 103, a second material layer 104, and a second electrode 105. The first material layer 102, the light-emitting layer 103, and the second material layer 104 are disposed between the first electrode 101 and the second electrode 105. The light-emitting layer 103 is disposed between the first material layer 102 and the second material layer 104. The first material layer 102 is disposed between the first electrode 101 and the light-emitting layer 103. In this embodiment, the first electrode 101, the first material layer (the first GaN layer) 102, the light-emitting layer 103, the second material layer (the second GaN layer) 104, and the second electrode 105 can be a p-type electrode, a p-GaN layer, a multi-quantum wells (MQWs), a n-GaN, and a n-type electrode, respectively, but they are not limited thereto.

The first electrode 101 has a length L in the first direction and a width W in the second direction. When the light-emitting member 100 having the vertical LED chip is joined to the bonding pad 300, the first electrode 101 faces the bonding pad 300 and connects thereto. As shown in FIGS. 4A and 4B, the second pitch PX2 should be less than the sum of the first pitch PX1 and two-thirds of the length L (PX2<PX1+2/3L), and the third pitch PX3 should be less than the sum of the first pitch PX1 and two-thirds of the length L (PX3<PX1+2/3L), so as to prevent the first electrode 101 from simultaneously connecting to two bonding pads 300 in the first direction.

In the second direction, the fifth pitch PY2 should be less than the sum of the fourth pitch PY1 and two-thirds of the width W (PY2<PY1+2/3W), and the sixth pitch PY3 should be less than the sum of the fourth pitch PY1 and two-thirds of the width W (PY3<PY1+2/3W), so as to prevent the first electrode 101 from simultaneously connecting to two bonding pads 300 in the second direction.

Figure 6:
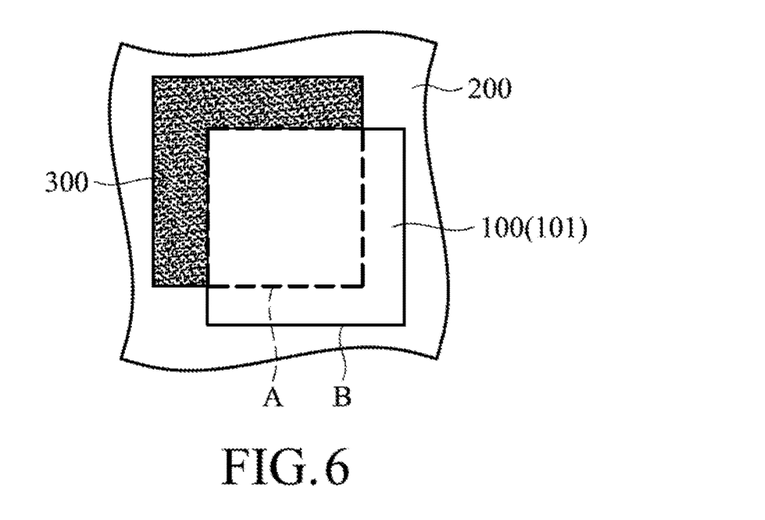
FIG. 6 is a schematic diagram of the light-emitting member and the bonding pad according to an embodiment of the disclosure.

Referring to FIG. 6, in view of the normal direction of the substrate 200 (Z-axis), the region of the bonding pad 300 covered by the light-emitting member 100 has a first area A, and the first electrode 101 of the light-emitting member 100 has a second area B. The first area A should be greater than one third of the second area B, so as to prevent the first electrode 101 from simultaneously connecting to two bonding pads 300.

Figure 7:
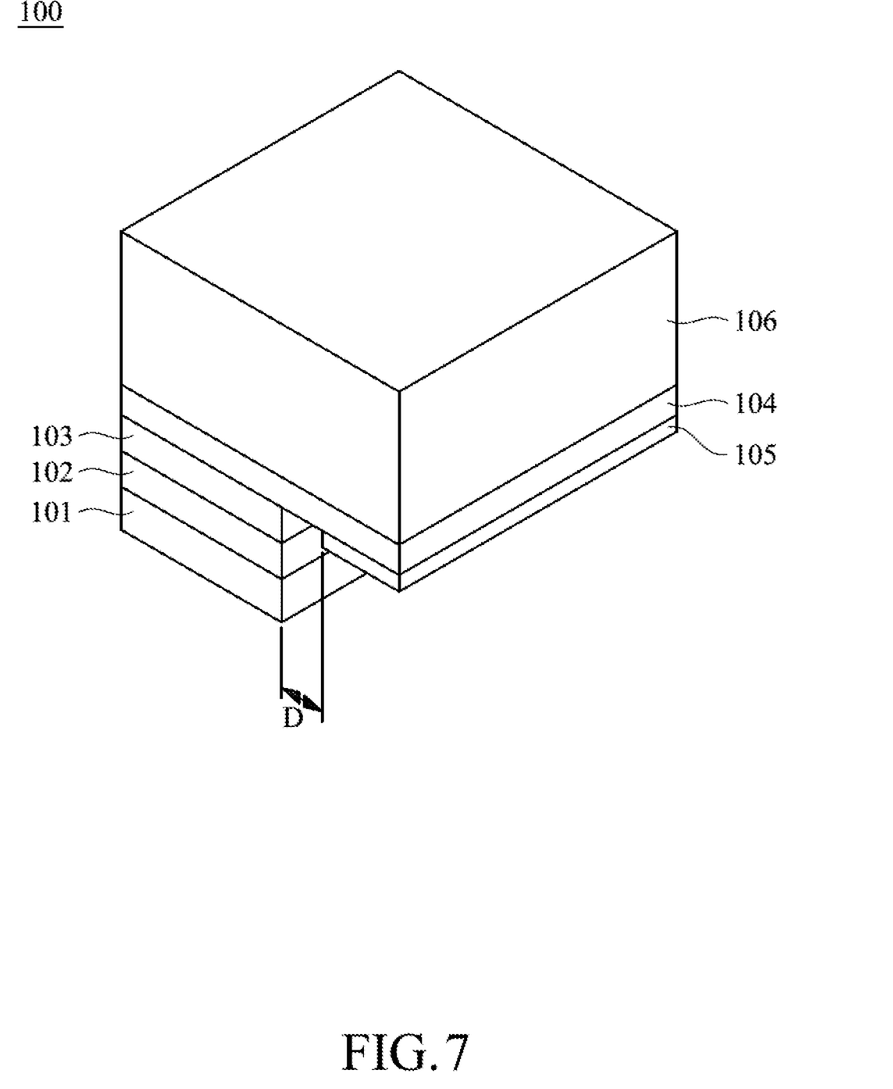
FIG. 7 is a schematic diagram of the light-emitting member according to another embodiment of the disclosure.

Referring to FIG. 7, in another embodiment, the light-emitting member 100 can be a flip LED chip including a first electrode 101, a first material layer 102, a light-emitting layer 103, a second material layer 104, a second electrode 105, and a base 106. The second material layer 104 is disposed on the base 106. The light-emitting layer 103 and the second electrode 105 are disposed on the second material layer 104. The first material layer 102 is disposed on the light-emitting layer 103. The first electrode 101 is disposed on the first material layer 102. In this embodiment, the first electrode 101, the first material layer (the first GaN layer) 102, the light-emitting layer 103, the second material layer (the second GaN layer) 104, the second electrode 105, and the base 106 can be a p-type electrode, a p-GaN layer, a multi-quantum wells (MQWs), a n-GaN, a n-type electrode, and a sapphire substrate, respectively, but they are not limited thereto.

Since the first electrode 101 and the second electrode 105 are disposed on the same side of the light-emitting member 100 in this embodiment, the first electrode 101 and the second electrode 105 can be each connected to one bonding pad 300 when connecting the light-emitting member 100. In other words, one light-emitting member 100 is connected to two bonding pads 300.

As shown in FIG. 7, a distance D is formed between the first electrode 101 and the second electrode 105. The second pitch PX2 should be less than the sum of the first pitch PX1 and the distance D (PX2<PX1+D), and the third pitch PX3 should be less than the sum of the first pitch PX1 and the distance (PX3<PX1+D), so as to prevent the first electrode 101 or the second electrode 105 from simultaneously connecting to two bonding pads 300 in the first direction. Furthermore, the fifth pitch PY2 should be less than the sum of the fourth pitch PY1 and the distance D (PY2<PY1+D), and the sixth pitch PY3 should be less than the sum of the fourth pitch PY1 and the distance D (PY3<PY1+D), so as to prevent the first electrode 101 or the second electrode 105 from simultaneously connecting to two bonding pads 300 in the second direction, or prevent the first electrode 101, the second electrode 102, and two bonding pads 300 not being to form a loop circuit.

The electronic device E formed by the substrate 200, the bonding pads 300, and the light-emitting members 100 can be a panel or a display, such as a quantum dots light-emitting diode display (QLED Display), a light-emitting diode display (including micro LED display and mini LED display), a mosaic display, or a flexible display, but it is not limited thereto.

According to the aforementioned description, the electronic device E shown in FIGS. 4A and 4B can be produced using the following manufacturing method. First, a pressure bonding device C having a flexible layer 20 can be provided, and a plurality of light-emitting members 100 can be attached to the flexible layer 20. Second, a substrate 200 with a plurality of boding pads 300 can be provided. Finally, the light-emitting member 100 and the bonding pads 300 can be joined together using the pressure bonding device C. After the light-emitting members 100 are joined to the bonding pads 300, the light-emitting members 100, the substrate 200, and the bonding pads 300 can form the electronic device E shown in FIGS. 4A and 4B.

Figure 8:
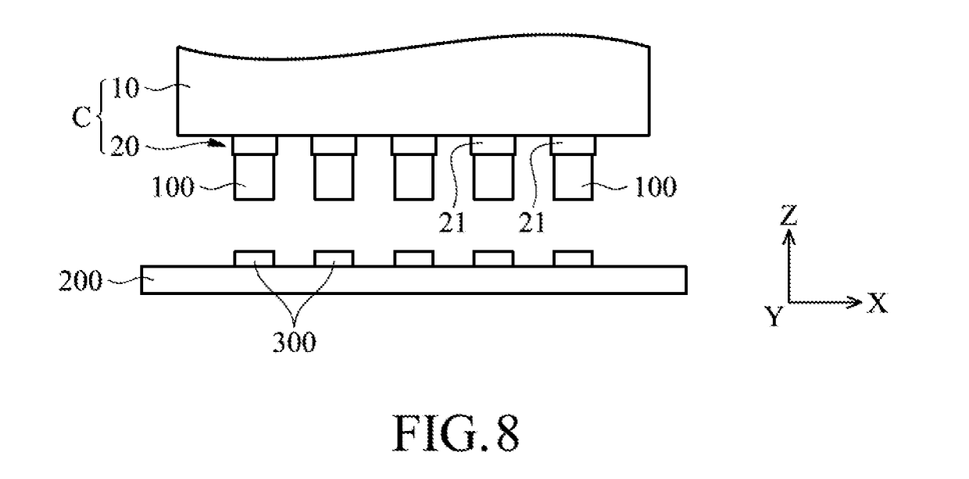
FIG. 8 is a schematic diagram of a pressure bonding device, a plurality of light-emitting members, a substrate, and a plurality of bonding pads according to another embodiment of the disclosure.

Referring to FIG. 8, in another embodiment of the present disclosure, the flexible layer 20 of the pressure bonding device C includes a plurality of blocks 21 separated from each other. The positions of these blocks 21 correspond the positions of the bonding pads 300 on the substrate 200. When using the pressure bonding device C to attach the light-emitting members 100, the light-emitting members 100 can be attached on the blocks 21, so as to enhance the deforming range of the flexible layer 20.

Figure 9:
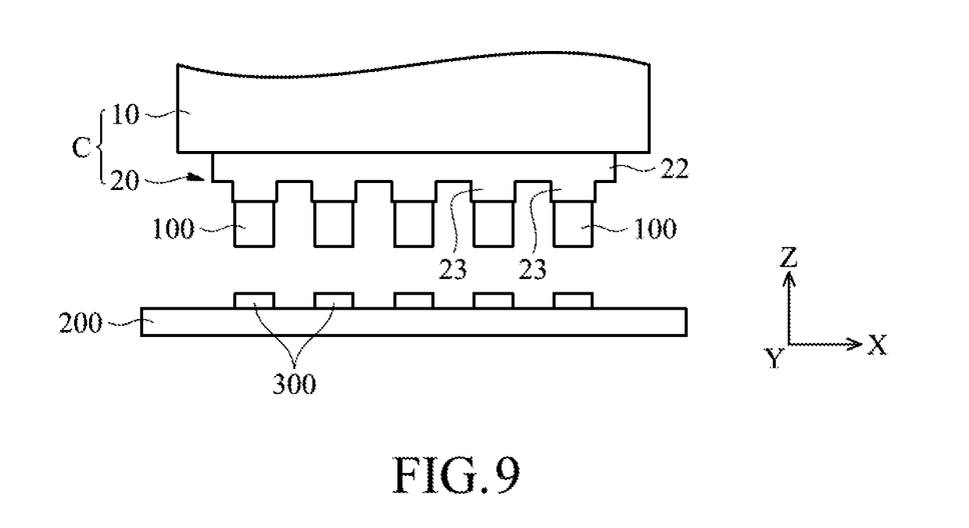
FIG. 9 is a schematic diagram of a pressure bonding device, a plurality of light-emitting members, a substrate, and a plurality of bonding pads according to another embodiment of the disclosure.
Figure 10:
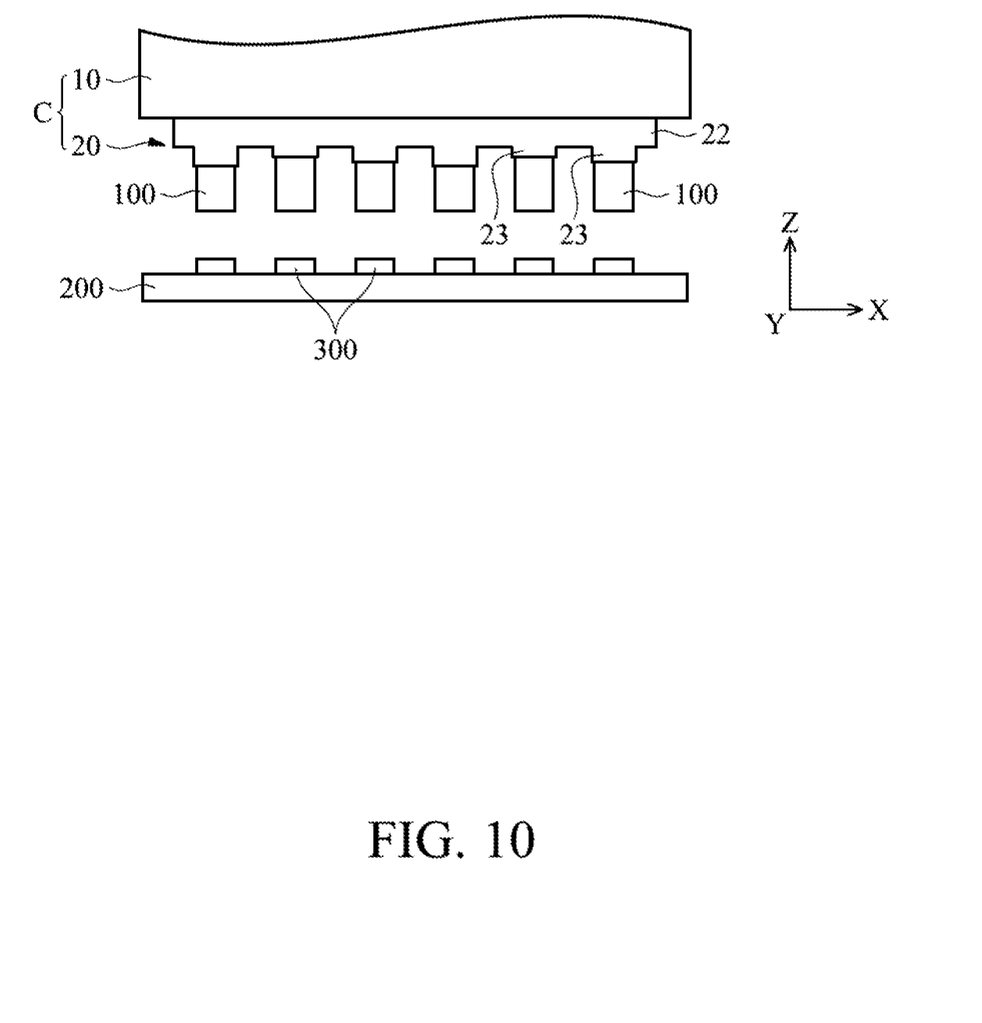
FIG. 10 is a schematic diagram of a pressure bonding device, a plurality of light-emitting members, a substrate, and a plurality of bonding pads according to another embodiment of the disclosure.

Referring to FIG. 9, in another embodiment of the present disclosure, the flexible layer 20 of the pressure bonding device C includes a bottom portion 22 and a plurality of protrusions 23. The protrusions 23 are connected to the bottom portion 22 and protrude in a direction away from the bonding head 10. When using the pressure bonding device C to attach the light-emitting members 100, the light-emitting members 100 can be attached on the protrusions 21. Since the flexible layer 20 includes the bottom portion 22 and the protrusions 23, it can be easily replaced when the flexible layer 20 is broken. As shown in FIG. 10, in some embodiments, the protrusions 23 can have different heights, so as to match the light-emitting members 100 having different epitaxial heights. After the light-emitting members 100 are attached to the protrusions 23, the surfaces of the light-emitting members 100, which are not attached to the flexible layer 20, are substantially aligned with each other. Thus, the joining between the light-emitting members 100 and the bonding pads 300 on the substrate 200 can be facilitated.

Referring to FIGS. 11A-11E, in another embodiment of the present disclosure, the pressure bonding device C includes a bonding head 10, a conveyor 30, and a picking head 40. The method for continuously manufacturing the electronic device E by using this pressure bonding device C is discussed below.

Figure 11A:
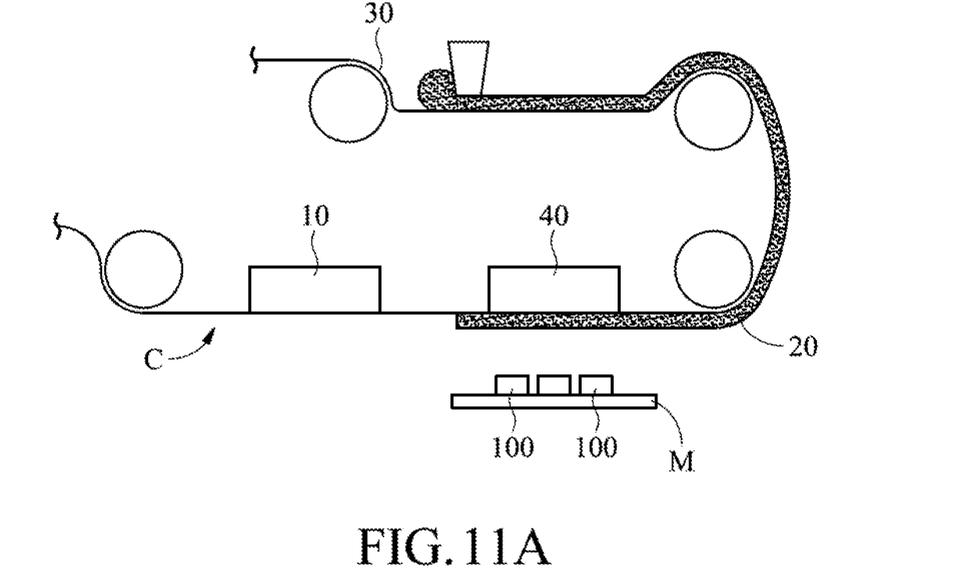
FIG. 11A is a schematic diagram that represents that the flexible material is coated on the conveyor to form the flexible layer according to another embodiment of the disclosure.
Figure 11B:
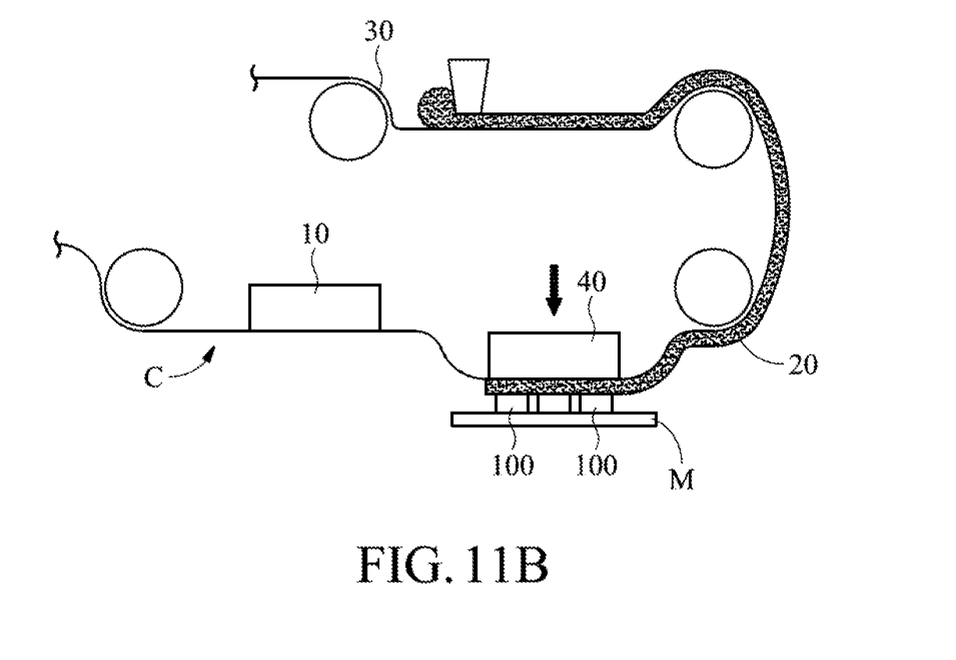
FIG. 11B is a schematic diagram that represents that the picking head pushes the conveyor to connect the light-emitting members to the flexible layer according to another embodiment of the disclosure.

As shown in FIG. 11A, first, a flexible material can be coated on the conveyor 30 manually or with an apparatus (such as slit coating), and the adhesive flexible layer 20 can be formed on the conveyor 30. Second, as shown in FIG. 11B, the conveyor 30 transfers the flexible layer 20 to the position above a platform M, wherein the light-emitting members 100 are disposed on the platform M. The picking head 40 moves downwardly to push the conveyor 30, and the flexible layer 20 contacts the light-emitting members 100, therefore, the light-emitting members 100 can be attached on the flexible layer 20.

Figure 11C:
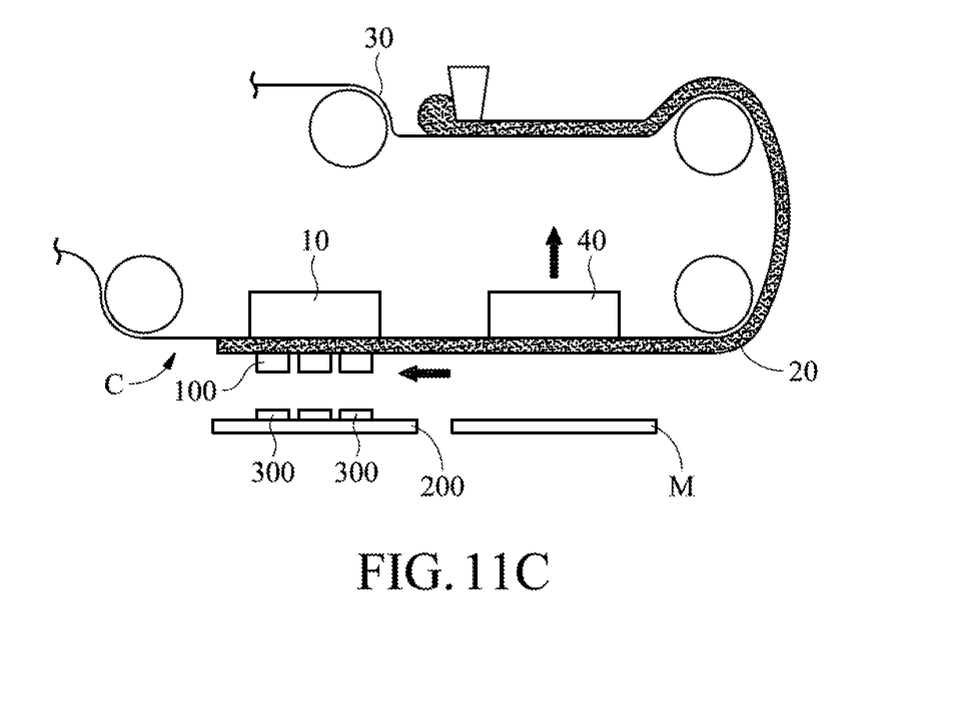
FIG. 11C is a schematic diagram that represents that the conveyor transfers the light-emitting members attached on the flexible layer to a position where the light-emitting members is aligned with the bonding pads according to another embodiment of the disclosure.

Next, as shown in FIG. 11C, the picking head 40 can move along the direction away from the platform M and does not apply force on the conveyor 30, and then the conveyor 30 can move the light-emitting members 100 on the flexible layer 20 to the position above the substrate 200, wherein the light-emitting members 100 correspond to the bonding pads 300 on the substrate 200.

Figure 11D:
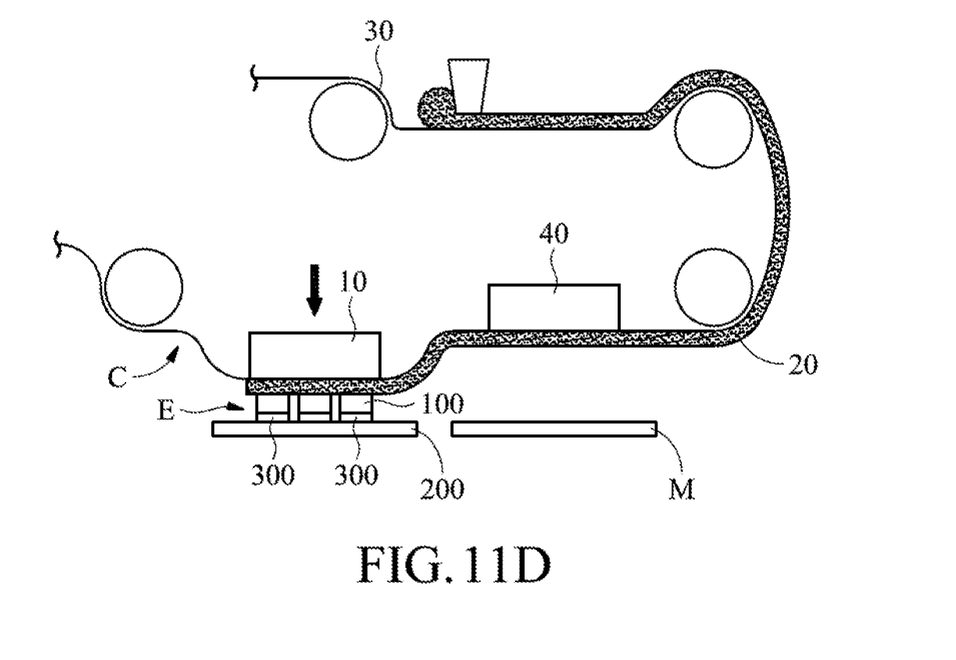
FIG. 11D is a schematic diagram that represents that the bonding head pushes the conveyor to connect the light-emitting members to the bonding pads according to another embodiment of the disclosure.
Figure 11E:
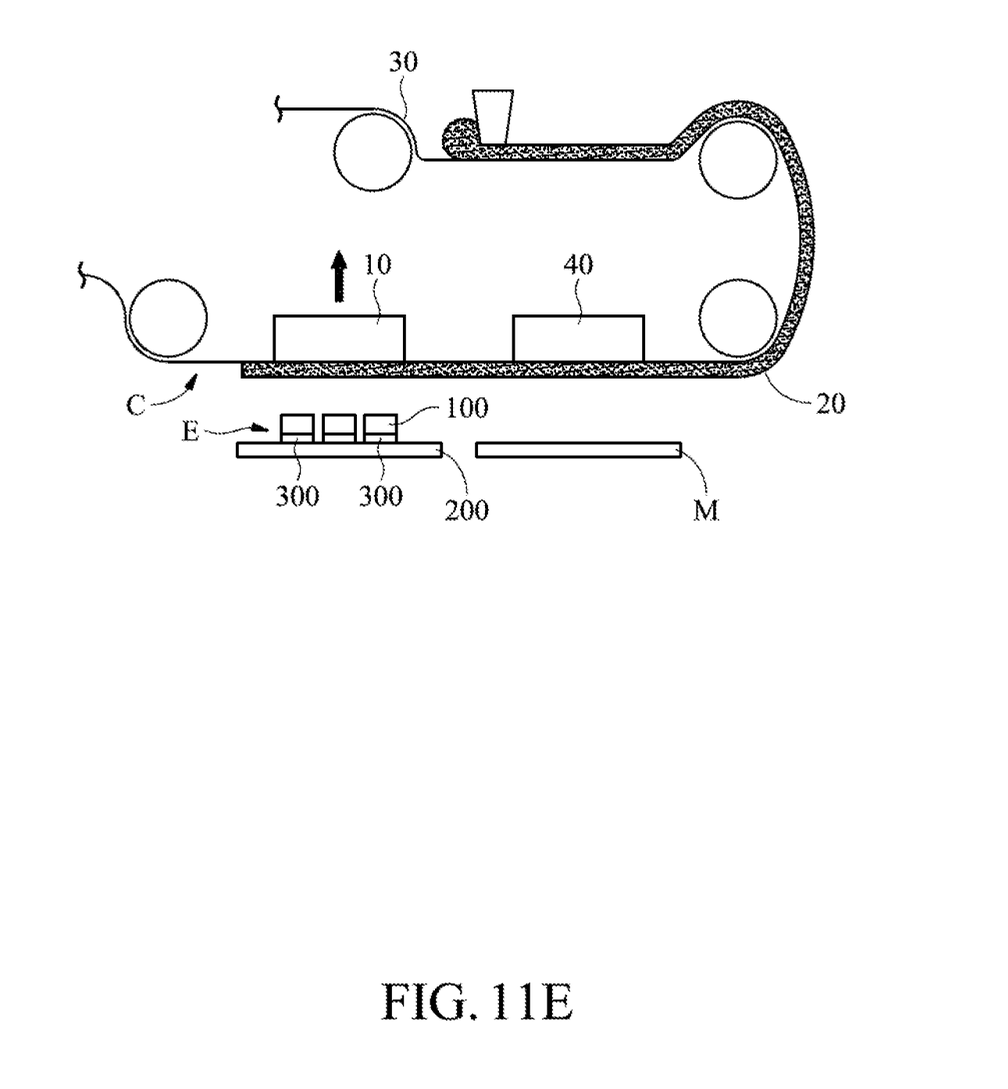
FIG. 11E is a schematic diagram that represents that the bonding head moves and the light-emitting members are separated from the flexible layer according to another embodiment of the disclosure

Finally, referring to FIG. 11D, the bonding head 10 can move toward the substrate and push the conveyor 30, and the light-emitting members 100 can contact the bonding pads 300. The light-emitting members 100 and the bonding pads 300 can be joined together, for example, by eutectic bonding or low-temperature bonding (less than 400° C.), but it is not limited thereto. The electronic device E can be therefore produced. As shown in FIG. 11E, after the electronic device E is assembled, the bonding head 10 can move along the direction away from the platform M and does not apply force on the conveyor 30. Since the bonding force between the light-emitting members 100 and the bonding pads 300 is greater than the adhesive force between the flexible layer 20 and the light-emitting members 100, the bonding head 10 can move upwardly and the light emitting members 100 can be separated from the flexible layer 20.

The electronic devices E can be continuously manufactured by this pressure bonding device C. The process for replacing the flexible layer 20 when the flexible layer 20 is failure (such as losing the viscosity) can be omitted.

In summary, an electronic device is provided, including a substrate, a plurality of bonding pads, and a plurality of light-emitting members, wherein the bonding pads are disposed on the substrate, and the light-emitting members are disposed on the bonding pads. The light-emitting members can be divided into a first group, a second group, and a third group in a first direction, and the first group, the second group, and the third group are arranged along the first direction in sequence. The first group has pair of adjacent light-emitting members, and a first pitch is formed between these adjacent light-emitting members. The second group has pair of adjacent light-emitting members, and a second pitch is formed between these adjacent light-emitting members. The third group has pair of adjacent light-emitting members, and a third pitch is formed between these adjacent light-emitting members. The third pitch is greater than the second pitch, and the second pitch is greater than the first pitch.

A method for manufacturing an electronic device is also provided, including: providing a pressure bonding device having a flexible layer, wherein the flexible layer is adhesive; attaching a plurality of light-emitting members on the flexible layer; providing a substrate, wherein a plurality of bonding pads are disposed on the substrate; and joining the light-emitting members and the bonding pads using the pressure bonding device, through a method such as eutectic bonding, low-temperature bonding, ACF bonding, or glue bonding, but it is not limited thereto.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the disclosure has been described by way of example and in terms of embodiment, it should be understood that the disclosure is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method for manufacturing an electronic device, comprising:
    providing a pressure bonding device having a flexible layer, wherein the flexible layer is adhesive;
    attaching a plurality of light-emitting members on the flexible layer;
    providing a substrate, wherein a plurality of bonding pads are disposed on the substrate; and
    joining the light-emitting members and the plurality of bonding pads;
    wherein the plurality of light-emitting members in a first direction comprise a first pair of adjacent light-emitting members having a first pitch, a second pair of adjacent light-emitting members having a second pitch, and a third pair of adjacent light-emitting members having a third pitch, and the first pair of adjacent light-emitting members, the second pair of adjacent light-emitting members, and the third pair of adjacent light-emitting members are arranged along the first direction in sequence;
    wherein the third pitch is greater than the second pitch, and the second pitch is greater than the first pitch.

2. The method for manufacturing the electronic device as claimed in claim 1, wherein the plurality of light-emitting members in a second direction comprise a fourth pair of adjacent light-emitting members having a fourth pitch, a fifth pair of adjacent light-emitting members having a fifth pitch, and a sixth pair of adjacent light-emitting members having a sixth pitch, and the first direction is different than the second direction;
    wherein the fourth pair of adjacent light-emitting members, the fifth pair of adjacent light-emitting members, and the sixth pair of adjacent light-emitting members are arranged along the second direction in sequence;
    wherein the sixth pitch is greater than the fifth pitch, and the fifth pitch is greater than the fourth pitch.

3. The method for manufacturing the electronic device as claimed in claim 1, wherein the flexible layer comprises a bottom portion and a plurality of protrusions, and the plurality of light-emitting members are attached on the plurality of protrusions when the plurality of light-emitting members are attached on the flexible layer.

4. The method for manufacturing the electronic device as claimed in claim 3, wherein the plurality of protrusions have different heights.

5. The method for manufacturing the electronic device as claimed in claim 4, wherein when the plurality of light-emitting members are attached on the plurality of protrusions, the surfaces of each of the plurality of light-emitting members, which are not attached to the flexible layer, are aligned with each other.

6. The method for manufacturing the electronic device as claimed in claim 1, wherein the flexible layer comprises a plurality of blocks separated from each other.

7. The method for manufacturing the electronic device as claimed in claim 1, wherein the step of providing the pressure bonding device further comprises coating a flexible material on a conveyor to form the flexible layer.

8. The method for manufacturing the electronic device as claimed in claim 7, wherein the method further comprises:
    pushing the conveyor with the flexible layer using a picking head, so as to connect the flexible layer to the light-emitting members.

9. The method for manufacturing the electronic device as claimed in claim 8, wherein the method further comprises:
    transferring the light-emitting members attached on the flexible layer to a position above the substrate with the conveyor; and
    aligning the plurality of light-emitting members with the plurality of bonding pads.

10. The method for manufacturing the electronic device as claimed in claim 9, wherein the method further comprises:
    pushing the conveyor using a bonding head, so as to connect the plurality of light-emitting members to the plurality of bonding pads.

11. A method for manufacturing an electronic device, comprising:
    providing a pressure bonding device having a flexible layer, wherein the flexible layer is adhesive and comprises a bottom portion and a plurality of protrusions, and the plurality of protrusions have different heights;
    attaching a plurality of light-emitting members on the plurality of protrusions of the flexible layer;
    providing a substrate, wherein a plurality of bonding pads are disposed on the substrate; and
    joining the light-emitting members and the plurality of bonding pads.

12. The method for manufacturing the electronic device as claimed in claim 11, wherein when the plurality of light-emitting members are attached on the plurality of protrusions, the surfaces of each of the plurality of light-emitting members, which are not attached to the flexible layer, are aligned with each other.

13. The method for manufacturing the electronic device as claimed in claim 11, wherein the step of providing the pressure bonding device further comprises coating a flexible material on a conveyor to form the flexible layer.

14. The method for manufacturing the electronic device as claimed in claim 13, wherein the method further comprises:
pushing the conveyor with the flexible layer using a picking head, so as to connect the flexible layer to the light-emitting members.

15. The method for manufacturing the electronic device as claimed in claim 14, wherein the method further comprises:
transferring the light-emitting members attached on the flexible layer to a position above the substrate with the conveyor;
aligning the plurality of light-emitting members with the plurality of bonding pads; and
pushing the conveyor using a bonding head, so as to connect the plurality of light-emitting members to the plurality of bonding pads.

16. A method for manufacturing an electronic device, comprising:
providing a pressure bonding device having a flexible layer, wherein the flexible layer is adhesive and comprises a plurality of blocks separated from each other;
attaching a plurality of light-emitting members on the flexible layer;
providing a substrate, wherein a plurality of bonding pads are disposed on the substrate; and
joining the light-emitting members and the plurality of bonding pads.

17. The method for manufacturing the electronic device as claimed in claim 16, wherein the step of providing the pressure bonding device further comprises coating a flexible material on a conveyor to form the flexible layer.

18. The method for manufacturing the electronic device as claimed in claim 17, wherein the method further comprises:
pushing the conveyor with the flexible layer using a picking head, so as to connect the flexible layer to the light-emitting members.

19. The method for manufacturing the electronic device as claimed in claim 18, wherein the method further comprises:
transferring the light-emitting members attached on the flexible layer to a position above the substrate with the conveyor;
aligning the plurality of light-emitting members with the plurality of bonding pads; and
pushing the conveyor using a bonding head, so as to connect the plurality of light-emitting members to the plurality of bonding pads.

20. The method for manufacturing the electronic device as claimed in claim 16, wherein the step of attaching the plurality of light-emitting members on the flexible layer comprises attaching the plurality of light-emitting members on the plurality of blocks of the flexible layer.

\* \* \* \* \*